US005939656A

United States Patent [19]
Suda

[11] Patent Number: 5,939,656

[45] Date of Patent: Aug. 17, 1999

[54] MUSIC SOUND CORRECTING APPARATUS AND MUSIC SOUND CORRECTING METHOD CAPABLE OF ACHIEVING SIMILAR AUDIBILITIES EVEN BY SPEAKER/HEADPHONE

[75] Inventor: Masayuki Suda, Hamamatsu, Japan

[73] Assignee: Kabushiki Kaisha Kawai Gakki Seisakusho, Japan

[21] Appl. No.: 09/193,984

[22] Filed: Nov. 18, 1998

[30] Foreign Application Priority Data

Nov. 25, 1997 [JP] Japan .................................... 9-339404

[51] Int. Cl.[6] .............................. G10H 1/02; G10H 1/32; H03G 3/00

[52] U.S. Cl. ................................ 84/630; 84/644; 84/707; 84/DIG. 9; 84/DIG. 26; 381/63

[58] Field of Search ..................... 84/615–620, 622–633, 84/644, 653–665, 678–690, 692–711, 735–746, 670, 718–721, DIG. 9, DIG. 26; 381/63–65

[56] References Cited

U.S. PATENT DOCUMENTS 5,604,810 2/1997 Yanagawa ............................. 84/630 X

*Primary Examiner*—Stanley J. Witkowski
*Attorney, Agent, or Firm*—Christie, Parker & Hale, LLP

[57] ABSTRACT

A music sound correcting apparatus for correcting a music sound signal entered thereinto to selectively supply the corrected music sound signal to a speaker and a headphone, is provided with a jack into which a plug of the headphone is inserted, and a detector for detecting whether or not this plug of the headphone is inserted into the jack. When the detector detects that the plug is not inserted into the jack, a frequency of the entered music sound signal is changed so as to be properly reproduced by the speaker. On the other hand, when the detector detects that this plug is inserted into the jack, the entered music sound signal is corrected so as to be properly reproduced by the headphone in such a manner that a sound image produced based upon the entered music sound signal is localized to a predetermined position. As a result, preferable music sound can be reproduced even when the speaker is used and the headphone is employed irrespective of a small amount of hardware.

20 Claims, 9 Drawing Sheets

MUSIC SOUND CORRECTING APPARATUS AND MUSIC SOUND CORRECTING METHOD CAPABLE OF ACHIEVING SIMILAR AUDIBILITIES EVEN BY SPEAKER/HEADPHONE

BACKGROUND OF THE INVENTION

1. Field of the Invention

The present invention generally relates to a music sound correcting apparatus and a music sound correcting method for correcting music sounds. More specifically, the present invention is directed to a technique capable of correcting music sounds in such a manner that even when music sounds of electronic musical equipments are reproduced by using a speaker, or a headphone, similar audibilities can be established.

2. Description of the Related Art

In general, music sounds produced from electronic musical instruments such as electronic pianos and electronic keyboards can be heard through speakers, or headphones. Referring now to drawings, a conventional electronic musical instrument will be described.

FIG. 1 is a schematic block diagram for mainly indicating a signal output system of one typical conventional electronic musical instrument. This electronic musical instrument is mainly arranged by a central processing unit (will be referred to as a "CPU" hereinafter) 50, a keyboard 51, a sound source 52, a preamplifier 53, a sound volume controller 54, a main amplifier 55, a switch 56, a speaker 57, a headphone amplifier 58, and also a headphone jack 59. A plug 61 of the headphone 60 is inserted into the headphone jack 59. The switch 56 is turned OFF when the plug 61 of the headphone 60 is inserted into the headphone jack 59, whereas this switch 56 is turned ON when this plug 61 is pulled out from the headphone jack 59.

The keyboard data produced by operating the keyboard 51 is supplied to the CPU 50. The CPU 50 produces the music sound data based on this keyboard data, and then supplies this music sound data to the sound source 52. The sound source 52 produces the analog music sound signal based on this music sound data, and then supplies this analog music sound signal to the preamplifier 53. The preamplifier 53 amplifies the analog music sound signal supplied from the sound source 52 by an amplification factor defined based upon the sound volume control signal derived from the sound volume controller 54. Then, the amplified analog music sound signal is supplied to the main amplifier 55 and the headphone amplifier 58.

The main amplifier 55 amplifies the analog music sound signal amplified by the preamplifier 53 so as to produce such a signal having a sufficiently large amplitude capable of driving the speaker 57, and then supplies this amplified music sound signal to the switch 56. When the plug 61 of the headphone 60 is not inserted into the headphone jack 59, this amplified music sound signal derived from the main amplifier 55 is supplied via this switch 56 to the speaker 57. As a result, the music sound can be reproduced from the speaker 57.

On the other hand, the headphone amplifier 58 amplifies the analog music sound signal amplified by the preamplifier 53 so as to produce such a signal having a sufficiently large amplitude capable of driving the headphone 60, and then supplies this amplified music sound signal to the headphone jack 59. When the plug 61 of the headphone 60 is inserted into the headphone jack 59, this amplified music sound signal derived from the headphone amplifier 58 is supplied via this headphone jack 59 and the plug 61 to the headphone 60. As a result, the music sound can be reproduced from the headphone 60. In this case, since the switch 56 is turned OFF, no music sound is reproduced from the speaker 57.

The conventional electronic musical instrument with the above arrangement owns the following problem. That is, when one music sound (music sound source) is reproduced, the audience has different audibilities when the music sound is reproduced from the speaker, and also when this music sound is reproduced from the headphone. This problem may be caused by the differences existed in the frequency characteristics, the sound image localizing mechanism, and the reverberation characteristics while the same music sound is reproduced by employing the speaker and the headphone. Now, these factors will be explained as follows:

(1). Frequency characteristic

In general, a frequency characteristic of a speaker is considerably deteriorated, as compared with a frequency characteristic of a headphone. Also, the frequency characteristic of the medium and low sound ranges is greatly influenced by enclosures. Furthermore, in an electronic musical instrument, a speaker is not always located at an ideal speaker setting position with respect to an audience, which is completely different from a so-called "audio apparatus". As a result, the frequency characteristic is also adversely influenced by the directivity of the speaker.

As a consequence, in order to improve the frequency characteristic when the music sound is reproduced by using the speaker in the conventional electronic musical instrument, as illustrated in FIG. 2, an equalizer circuit 70 is provided between the preamplifier 53 and the main amplifier 55. This equalizer circuit 70 controls the gains of the plural frequency ranges. As a result, the frequency characteristic obtained during the speaker reproducing operation can be improved. For instance, as shown in FIG. 3, as this equalizer circuit 70, the gains of the three frequency ranges can be independently controlled. It should be noted that since the arrangement and the operation of this equalizer circuit 70 are well known in the field, a detailed description thereof is omitted.

(2). Sound image localization

The frequency characteristic obtained while the music sound is reproduced by employing the headphone is not so deteriorated, as compared with the above-explained speaker reproducing operation. However, there is such a trend that the sound images are concentrated around the head of the audience to be localized. This is caused by the following reason. That is, as indicated in FIG. 4, when the audience hears the sounds reproduced from the speaker, the sound reproduced from the left speaker SPL in response to the left-channel signal reaches the left ear of the audience and further reaches the right ear of this audience. Similarly, the sound reproduced from the right speaker in response to the right channel signal reaches the right ear of the audience and also reaches the left ear of this audience.

In this case, both the sound which reaches from the left speaker SPL to the left ear of the audience, and the sound which reaches from the right speaker SPR to the right ear of this audience are referred to as "direct sounds" (indicated by solid lines). Also, both the sound which reaches from the left speaker SPL to the right ear of the audience, and the sound which reaches from the right speaker SPR to the left ear of this audience are referred to as "crosstalk sounds" (indicated by broken lines).

On the other hand, when the audience hears the music sound reproduced by using the headphone, the sound reproduced in response to the left-channel signal reaches only the left ear of this audience, and the sound reproduced in response to the right-channel signal reaches only the right ear of this audience. In other words, only the direct sounds are entered to the ears of the audience, and no crosstalk sounds are entered. This phenomenon may cause that the sound images are concentrated around the head of this audience to be localized. In this case, when the audience uses the headphone long time, there is a problem that this audience has weary feelings.

Also, different from the above-explained speaker reproducing operation, when the audience hears the sounds reproduced by using the headphone, this audience is not completely adversely influenced by the directivity of the speaker at the listening point. As a consequence, the audience may have a sense of incongruity, since such a sound which can be hardly heard by the audience during the speaker reproducing operation may be heard during the headphone reproducing operation, and conversely, such a sound which can be surely heard by the audience during the speaker reproducing operation may not be heard during the headphone reproducing operation.

To solve these problems, when the music sound is reproduced by the headphone, the two techniques have been developed, namely the first technique capable of adding the crosstalk sound to the direct sound so as to localize the sound image, and the second technique capable of employing the external-ear transfer function so as to localize the sound image.

In accordance with the first localizing technique, for example, such a circuit as shown in FIG. 5 may be used. That is, the signal produced by delaying the left-channel input signal Lin by the delay device 80*a* is added to the right-channel input signal Rin by the adder 81*b* so as to produce the right-channel output signal Rout. Similarly, the signal produced by delaying the right-channel input signal Rin by the delay device 80*b* is added to the left-channel input signal Lin by the adder 81*a* so as to produce the left-channel output signal Lout. The delay amount of each of the delay devices 80*a* and 80*b* is equal to a difference between time during which a direct sound reaches one ear, and time during which a crosstalk sound reaches this ear (will be referred to as an "inter aural time difference" hereinafter), for instance, is on the order of 0.2 ms.

In accordance with the second localizing technique, for example, such a circuit as indicated in FIG. 6 may be used. This circuit is arranged by the filters 90*a* and 90*b* for simulating the external-ear transfer function of the direct sound; the filters 91*a* and 91*b* for simulating the external-ear transfer function of the crosstalk sound; the delay devices 92*a* and 92*b* for simulating the inter aural time differences; and also the adders 93*a* and 93*b*. In this circuit, the adder 93*a* adds the signal produced by filtering the left-channel input signal Lin by the filter 90*a* to another signal which is produced by filtering the right-channel input signal Rin by the filter 91*b* and further by delaying this filtered input signal by the delay device 92*b* so as to produce the left-channel output signal Lout. Similarly, the adder 93*b* adds the signal produced by filtering the right-channel input signal Rin by the filter 90*b* to another signal which is produced by filtering the left-channel input signal Lin by the filter 91*a* and further by delaying this filtered input signal by the delay device 92*a* so as to produce the right-channel output signal Lout. When the audience hears such sounds produced in response to the left-channel output signal Lout and the right-channel output signal Rout, which are produced by employing the first and second localizing techniques, the audience can feel that the sound image is clearly localized.

(3). Reverberation characteristics

As previously described, when the audience hears the music sounds reproduced from the headphone, only the direct sound is entered into the ears of this audience. In other words, all of the reverberation sounds occurred in the listening room when the audience hears the music sound reproduced from the speaker are cut. As a consequence, there is such a problem that when the audience hears the music sounds reproduced from the headphone, the audience cannot have the stereophonic feelings, but also a lack of front localization of the sound image.

As previously explained, in the conventional electronic musical instrument, when trying to obtain the preferable music sound reproduced from both the speaker reproducing operation and the headphone reproducing operation, the above-described various characteristics such as the frequency characteristic, the sound image localizing mechanism, and the reverberation characteristic must be necessarily improved. For this porpoise, the following various circuits are required, namely, the equalizer circuit capable of improving the frequency characteristic; the delay device/adder capable of clearly localizing the sound image; the filter/delay device/adder capable of simulating the external-ear transfer function; and the circuit capable of simulating the reverberation characteristic. However, if all of these circuits for improving characteristics are equipped with the conventional electronic musical instrument, the entire circuit scale is increased and the higher cost is required. Moreover, there is a useless characteristic improving circuit, because the speaker reproducing operation and the headphone reproducing operation are not carried out at the same time.

SUMMARY OF THE INVENTION

The present invention has been made to solve the above-described problems, and therefore, has an object to provide a music sound correcting apparatus and a music sound correcting method, capable of producing preferable music sounds even when music sounds are reproduced by employing a speaker and also a headphone even with employment of a small amount of system hardware.

To achieve the above-described object, a music sound correcting apparatus, according to a first aspect of the present invention, is featured by such a music sound correcting apparatus for correcting a music sound signal entered thereinto to selectively supply the corrected music sound signal to a speaker and a headphone, is provided with a jack into which a plug of the headphone is inserted;

a detector for detecting whether or not the plug of the headphone is inserted into the jack;

first correcting means for correcting the entered music sound signal to be properly reproduced by the speaker when said detector detects that the plug is not inserted into the jack; and second correcting means for correcting the entered music sound signal to be properly reproduced by the headphone when the detector detects that the plug is inserted into said jack.

The first correcting means which constitutes this music sound correcting apparatus may be arranged by an equalizing means for changing the frequency characteristic of the music sound produced in response to the input music sound signal. In accordance with this circuit arrangement, since the frequency characteristics obtained during the speaker reproducing operation can be changed with respect to each of the frequency ranges, the adverse influences caused by the directivities of the enclosures and the speaker can be eliminated.

Also, the second correcting means may be arranged by employing such a sound image localizing means for localizing the sound image formed based on the entered music sound signal to a preselected position. In accordance with this circuit arrangement, since the sound image produced during the headphone reproducing operation can be localized to the desirable position, such an adverse phenomenon that the sound images are concentrated around the head of the audience to be localized can be eliminated. Also, since the unwanted sounds can be suppressed and/or a lack of necessary sounds can be avoided, the audience does not have a sense of incongruity.

Also, this second correcting means may be arranged by further employing a reverberation adding means for adding a reverberation component to the entered music sound signal. In accordance with this reverberation adding means, since the similar reverberation sound to that of the speaker reproducing operation can be produced even when the music sound is reproduced from the headphone, the audience can have the stereophonic feelings and the forward sound image localizing feelings.

Also, to similarly achieve the above-explained object, a sound image correcting apparatus, according to a second aspect of the present invention, is featured by such a music sound correcting apparatus for correcting a music sound signal entered thereinto to selectively supply the corrected music sound signal to a speaker and a headphone, is provided with first storage means for storing an equalizing process program and a sound image localizing process program;

second storage means, the content of which is rewritable;

a jack into which a plug of the headphone is inserted;

a detector for detecting whether or not the plug of the headphone is inserted into the jack;

control means for transferring the equalizing process program read from the first storage means to the second storage means when the detector detects that the plug of the headphone is not inserted into the jack; and for transferring the sound image localizing process program read from the first storage means to the second storage means when the detector detects that the plug of the headphone is inserted into the jack; and a digital signal processor for processing the entered music sound signal such that when the equalizing process program is transferred to the second storage means by the control means, the entered music sound signal is corrected in accordance with the equalizing process program to be properly reproduced by the speaker, and when the sound image localizing process program is transferred to the second storage means by the control means, the entered music sound signal is corrected in accordance with the sound image localizing process program to be properly reproduced by the headphone.

In the case that the above-explained first and second correction means are realized by employing electronic circuits, as previously explained, the useless circuits are provided. However, when these first and second correction means are realized by executing the signal process operations by the digital signal processor (DSP), such useless circuits can be avoided. It should be understood that the storage capacity of such a software program for performing the signal process operation for the first and second correction means is only approximately 2 KB when the commercially available DSP is employed.

Furthermore, to achieve the above-explained object, a music sound correcting method, according to a third aspect of the present invention, is featured by such a music sound correcting method comprises the steps of:

detecting whether or not a plug of a headphone is inserted into a jack;

executing a first correction to an inputted music sound signal to be properly reproduced by a speaker when a detection is made such that the plug of the headphone is not inserted into the jack; and executing a second correction to the inputted music sound signal to be properly reproduced by the headphone when a detection is made such that the plug of the headphone inserted into the jack.

In this case, the first correcting may be realized by changing the frequency characteristics of the music sounds reproduced in response to the input music sound signal. Also, the second correction may be realized by localizing the sound image formed in response to the input music sound signal to a predetermined position. Furthermore, this second correction may be realized by adding the reverberation component to the input music signal.

BRIEF DESCRIPTION OF THE DRAWINGS

A more complete understanding of the teachings of the present invention may be acquired by referring to the accompanying figures, in which.

DESCRIPTION OF THE PREFERRED EMBODIMENTS

Referring now to drawings, a music sound correcting apparatus according to an embodiment of the present invention will be described.

(1). Arrangement of Music Sound Correction Apparatus

Figure 1:
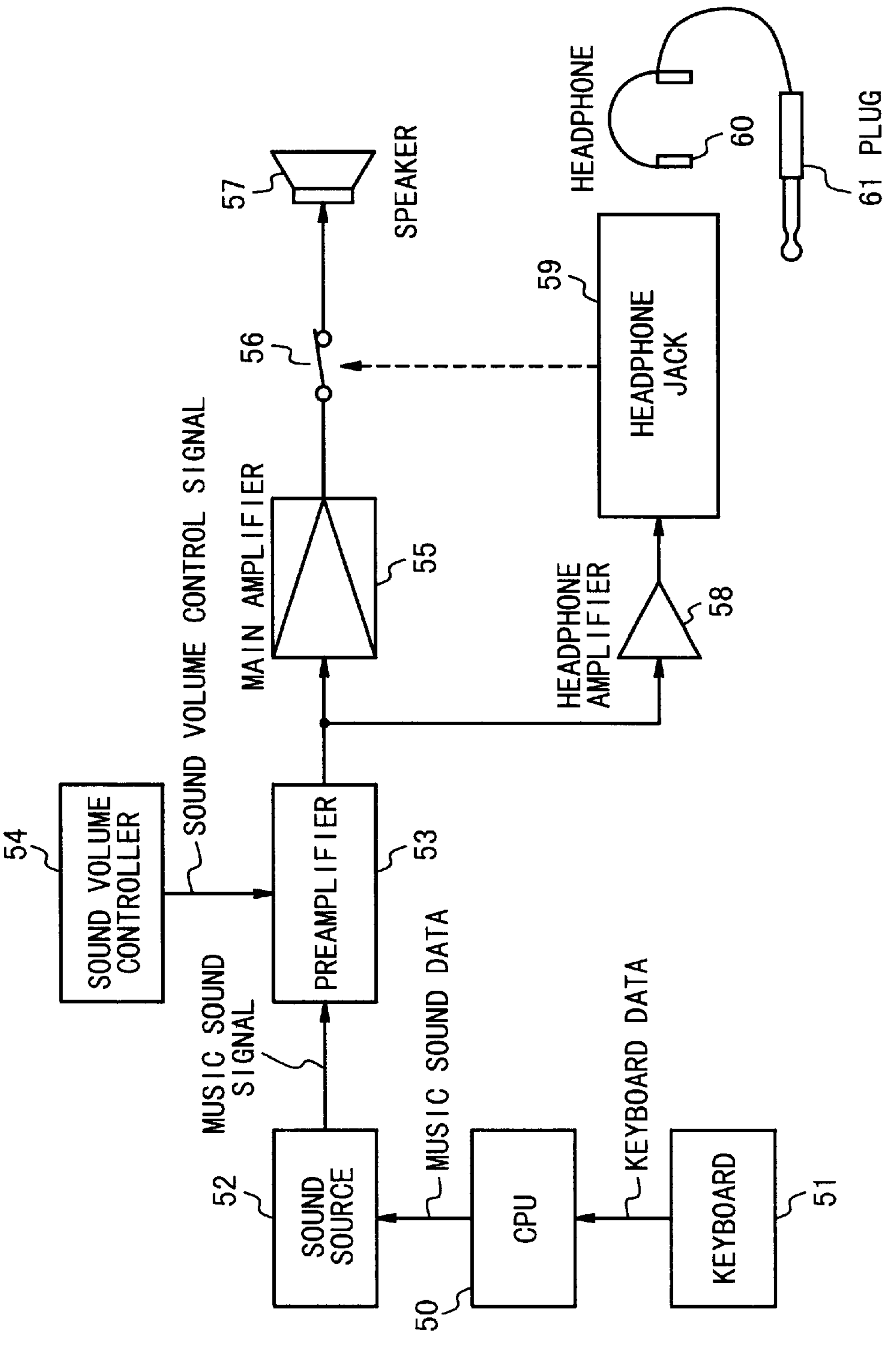
Fig. 1 PRIOR ART
FIG. 1 is a schematic block diagram for mainly representing the signal output system of the conventional electronic musical instrument.
Figure 2:
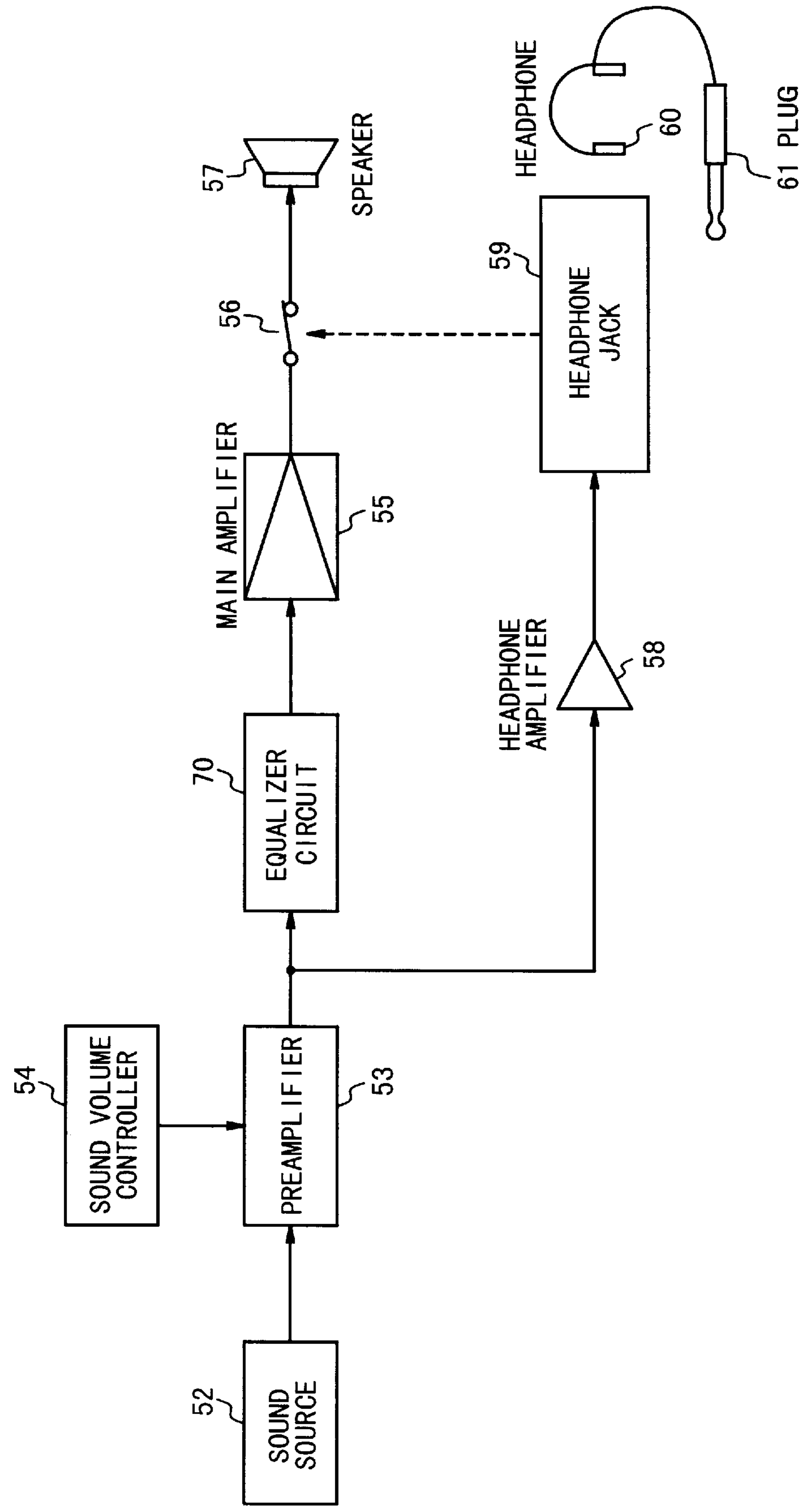
Fig. 2 PRIOR ART
FIG. 2 is an explanatory diagram for explaining the circuit arrangement capable of improving the frequency characteristic achieved during the speaker reproduction of the conventional electronic musical instrument.
Figure 3:
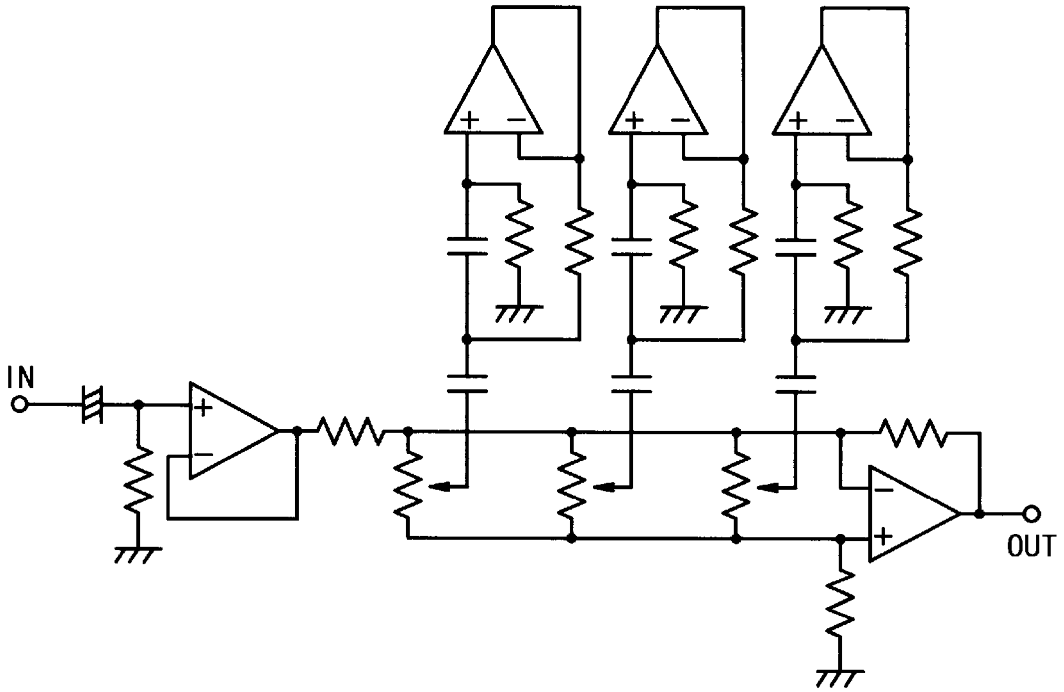
Fig. 3 PRIOR ART
FIG. 3 is a circuit diagram for indicating an example of the equalizer circuit shown in FIG. 2.
Figure 4:
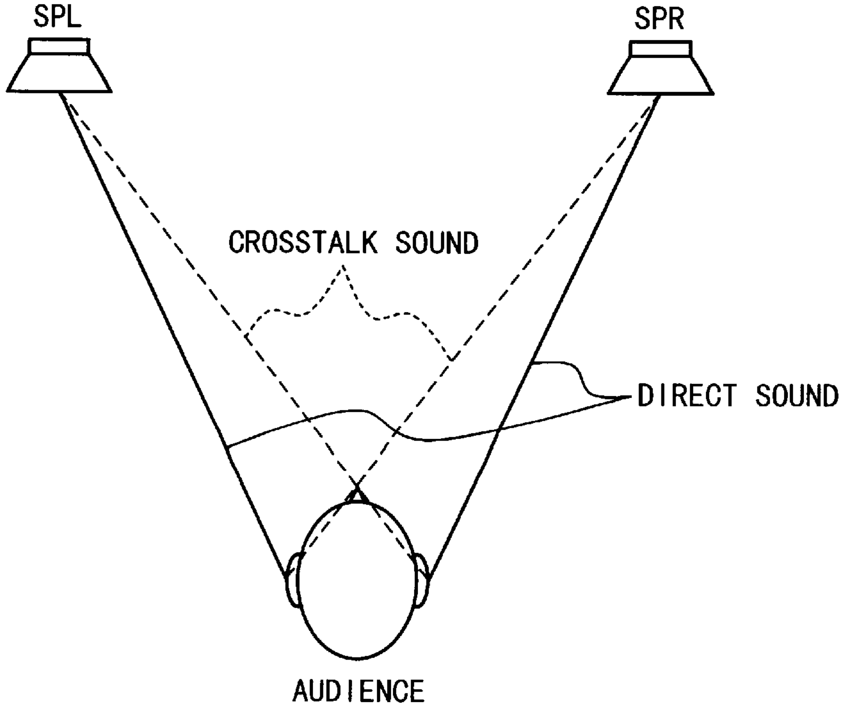
Fig. 4 PRIOR ART
FIG. 4 is an explanatory diagram for explaining the sound image localization mechanism in the conventional electronic musical instrument.
Figure 5:
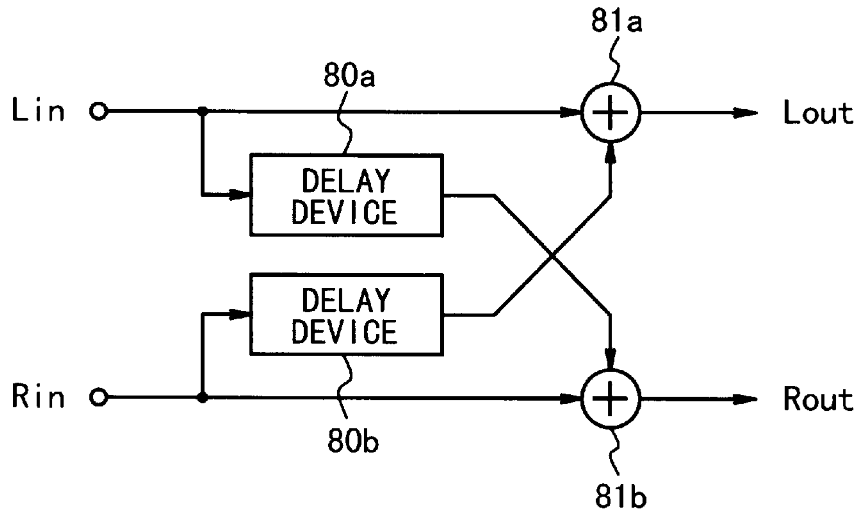
Fig. 5 PRIOR ART
FIG. 5 is a circuit diagram for indicating the circuit arrangement used to localize the sound image by adding the cross-talk sound in the conventional musical instrument.
Figure 6:
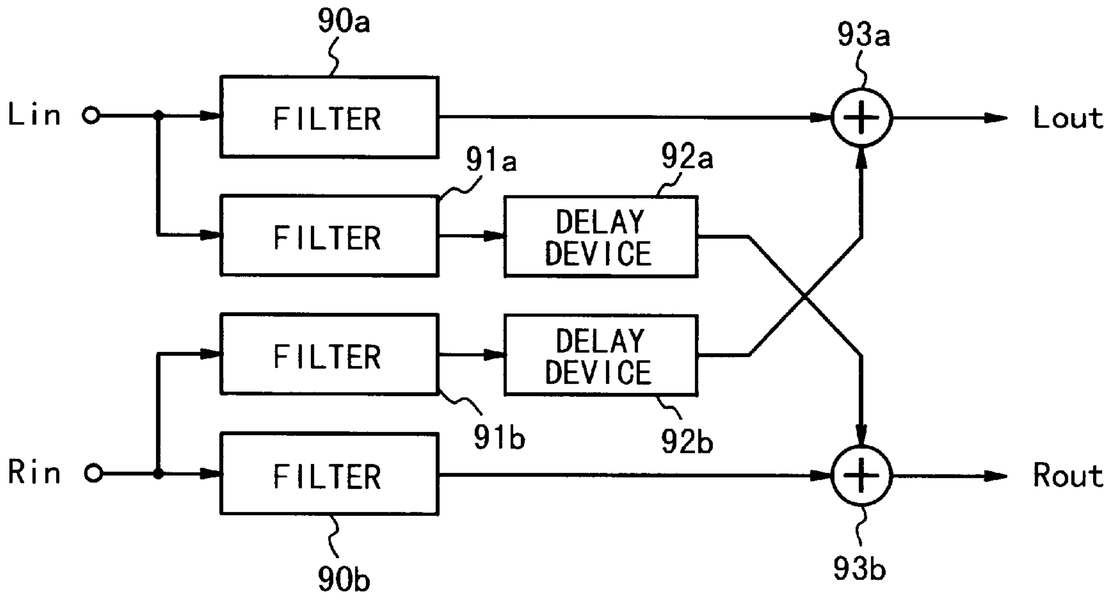
Fig. 6 PRIOR ART
FIG. 6 is a circuit diagram for indicating the circuit arrangement used to localize the sound image by the external-ear transfer function in the conventional electronic musical instrument.
Figure 7:
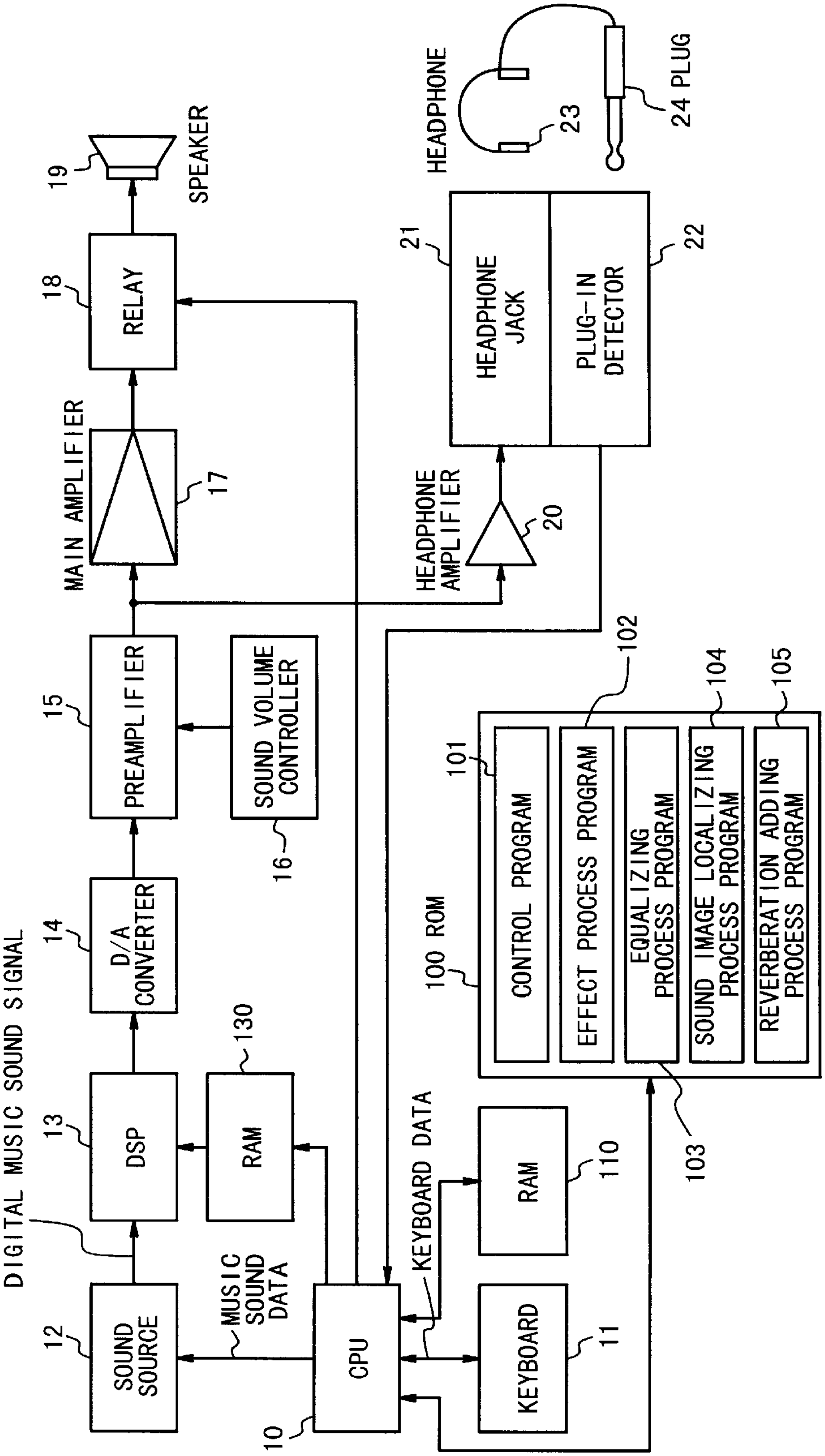
FIG. 7 is a schematic block diagram for representing an arrangement of an electronic musical instrument to which a music sound correcting apparatus according to an embodiment of the present invention is applied.

FIG. 7 is a block diagram for schematically showing an arrangement of an electronic musical instrument to which this music sound correcting apparatus of this embodiment is applied.

As indicated in FIG. 7, this electronic musical instrument is arranged by a CPU 10, a read-only memory (will be referred to as a "ROM" hereinafter) 100, a random access memory (will be referred to as a "RAM" hereinafter) 110, a keyboard 11, and a sound source 12. This electronic musical instrument is further arranged by a DSP 13, another RAM 130, a D/A converter 14, a preamplifier 15, a sound volume controller 16, a main amplifier 17, a relay 18, a speaker 19, a headphone amplifier 20, a headphone jack 21, and a plug-in detector 22. Also, a plug 24 of a headphone 23 is inserted into the headphone jack 21.

The CPU 10 is operated in accordance with a control program 101 previously stored into the ROM 10 while temporarily storing a calculation result thereof into the RAM 110. As a result, the functions of this electronic musical instrument can be realized and further a portion of functions (will be explained later) of the music sound correcting apparatus assembled in this electronic musical instrument.

The ROM 100 saves the above-described control program 101 and also a DSP program used to operate the DSP 13. The DSP program is transferred to the RAM 130 under control of the CPU 10. This DSP program contains an effect process program 102, an equalizing process program 103, a sound image localizing process program 104, and a reverberation adding process program 105.

The effect process program 102 involves a program and a coefficient, which are employed so as to add various effects such as a chorus, a tremolo, and a vibrato to music sounds. The equalizing process program 103 involves a program and a coefficient, which are employed so as to realize an equalizer function corresponding to first correcting means. The sound image localizing process program 104 involves a program and a coefficient, which are employed so as to realize a sound image localizing function corresponding to second correcting means. Also, the reverberation adding process program 105 involves a program and a coefficient, which are used to add reverberation to music sounds.

The keyboard 11 produces keyboard data in response to operation of a player. The keyboard data contains key numbers indicative of depressed keys and touch data representative of depression strength, or speed. The keyboard data produced from this keyboard 11 is supplied to the CPU 10. In response to the supplied keyboard data, the CPU 10 produces music sound data, and then supplies the music sound data to the sound source 12. The music sound data contains information required to produce a digital music sound signal.

The sound source 12 produces a digital music sound signal in response to the music sound data supplied from the CPU 10. As this sound source 12, for example, a PCM (pulse code modulation) sound source may be employed. Alternatively, as this sound source 12, not only the above-described PCM sound source, but also an harmonics synthesize sound source, an FM sound source, and other types of sound sources may be employed. The digital music sound signal produced in this sound source 12 is supplied to the DSP 13.

To the DSP 13, the RAM 130 is connected. This DSP 13 is operated in accordance with the program stored in the RAM 130 so as to process the digital music sound signal supplied from the sound source 12. This sound signal process contains the effect process, the equalizing process, the sound image localizing process, and the reverberation adding process. The sort of these sound signal processing operations may be determined based upon a program and a coefficient, which are loaded from the ROM 110 to the RAM 13 under control of the CPU 10. These music sound processing operations will be discussed more in detail later. The digital music sound signal outputted from this DSP 13 is supplied to the D/A converter 14.

The D/A converter 14 digital/analog-converts the entered digital music sound signal into an analog music sound signal thereof. The analog music sound signal outputted from this D/A converter 14 is supplied to the preamplifier 15.

The sound volume controller 16 is connected to the preamplifier 15. This sound volume controller 16 is provided on an operation panel (not shown) of the electronic musical instrument, and is used to control entire sound volume of this electronic musical instrument. The preamplifier 15 amplifies the analog music sound signal outputted from the D/A converter 14 by an amplification factor determined by a sound volume control signal supplied from the sound volume controller 16. Then, this preamplifier 15 supplies the amplified analog music sound signal to the main amplifier 17 and also the headphone amplifier 20.

The main amplifier 17 amplifies the analog music sound signal outputted from the preamplifier 15 in order to obtain a sufficiently large amplitude of the resultant analog music sound signal capable of driving the speaker 19. The amplified signal from this main amplifier 17 is supplied to the relay 18.

In response to a control signal supplied from the CPU 10, the relay 18 is controlled in such a manner that a contact of this relay 18 is opened/closed. This relay 18 may control to supply the analog music sound signal derived from the main amplifier 17 to the speaker 19. The speaker 19 converts the analog music sound signal supplied via the relay 18 from the main amplifier 17 into an acoustic signal. As a result, music sounds are reproduced from the speaker 19.

The headphone amplifier 20 amplifies the analog music sound signal outputted from the preamplifier 15 in order to obtain a sufficiently large amplitude of the resultant analog music sound signal capable of driving the headphone 23. The amplified signal from this headphone amplifier 20 is supplied to the headphone jack 21.

The plug 24 of the headphone 23 is inserted into this headphone jack 21. As a result, an analog music sound signal outputted from the headphone amplifier 20 is supplied to the headphone 23, and then is converted into an acoustic signal by a speaker included in the headphone 23.

The plug-in detector 22 is provided with the headphone jack 21. This plug-in detector 22 corresponds to a detector of the present invention. As this plug-in detector 22, for example, a mechanical switch may be employed, and this mechanical switch is mechanically turned ON/OFF in response to such a fact as to whether or not the plug 24 connected to the headphone 23 is inserted into this headphone jack 21. Alternatively, an optical switch and the like may be employed, and this optical switch is turned ON/OFF when light is interrupted, or passes through in response to such a fact as to whether or not the plug 24 is inserted into this headphone jack 21. A signal outputted from this plug-in detector 22 is supplied to the CPU 10.

(2). Equalizing Process Sound Image Localizing Process/Reverberation Process by DSP Referring now to FIG. 8 to FIG. 10, a description will now be made of the equalizing process, the sound image localizing process, and the reverberation process, which are executed by the DSP 13. These process operations may be realized by such a software manner that the DSP 13 is operated in accordance with a program loaded on the RAM 130. For the sake of simple explanations, each of these process operations will now be described with reference to a hardware block diagram equivalent to each of these process operations.

Figure 8:
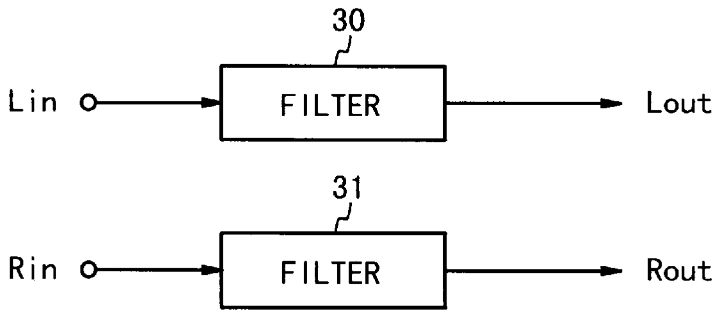
FIG. 8 is an explanatory diagram for explaining an equalizing process executed in DSP of FIG. 7.

When an acoustic signal is reproduced by employing the speaker 19, the CPU 10 transfers the equalizing process program 103 to the RAM 130. As a result, the DSP 13 executes the equalizing process operation. As represented in FIG. 8, the equalizing process operation may be realized by an equalizer arranged by a filter 30 and another filter 31. The filter 30 filters a left-channel input signal Lin contained in the digital music sound signal outputted from the sound source 12 to thereby output the filtered input signal as a left-channel output signal Lout. Similarly, the filter 31 filters a right-channel input signal Rin contained in the digital music sound signal outputted from the sound source 12 to thereby output the filtered input signal as a right-channel output signal Rout.

The filter 30 is constituted by a plurality of bandpass filters having different frequency passbands from each other. The filtering characteristics of the respective bandpass filters are determined based upon the filter coefficients, which are supplied from the CPU 10 together with the program for equalizing process at the same time. Similarly, the filter 31 is constituted by a plurality of bandpass filters having different frequency passbands from each other. The filtering characteristics of the respective bandpass filters are determined based upon the filter coefficients, which are supplied from the CPU 10 together with the program for equalizing process at the same time. These filters 30 and 31 may be arranged by, for example, a secondary IIR type filter. Since the software method for realizing the filters by way of the program process operation by the DSP is well known in this field, no further explanation thereof is made in the specification.

Figure 9:
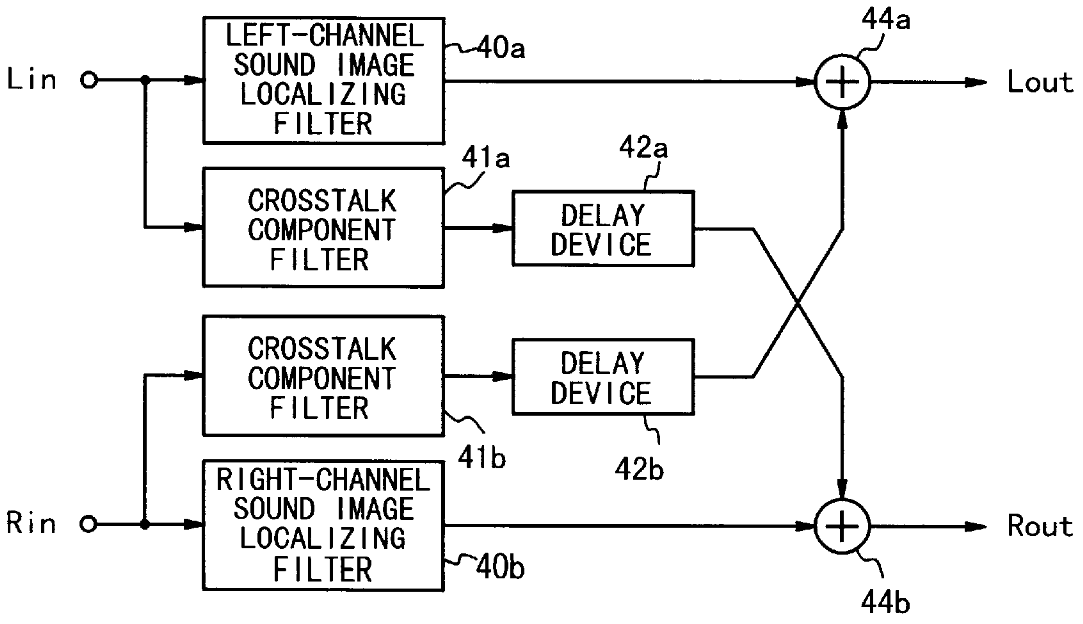
FIG. 9 is an explanatory diagram for explaining a sound image localizing process executed in DSP of FIG. 7.

When an acoustic signal is reproduced by using the headphone 23, the CPU 10 transfers the sound image localizing process program 104 to the RAM 130. As a result, the sound image localizing process operation is carried out in the DSP 13. This sound image localizing process operation may be realized by such a sound image localization apparatus. This sound image localization apparatus is arranged by, as indicated in FIG. 9, a left-channel sound image localizing filter 40*a*, a crosstalk component filter 41*a*, a delay device 42*a*, an adder 44*a*, a right-channel sound image localizing filter 40*b*, a crosstalk component filter 41*b*, a delay device 42*b*, and an adder 44*b*.

The left-channel sound image localizing filter 40*a* may simulate an external-ear transfer function for the left-channel. That is, the eternal-ear transfer function is applied to the left-channel input signal Lin contained in the digital music sound signal supplied from the sound source 12 by this left-channel sound image localizing filter 40*a*, and then the resulting left-channel input signal is supplied to the adder 44*a*. Similarly, the right-channel sound image localizing filter 40*b* may simulate an external-ear transfer function for the right-channel. That is, the eternal-ear transfer function is applied to the right-channel input signal Rin contained in the digital music sound signal supplied from the sound source 12 by this right-channel sound image localizing filter 40*b*, and then the resulting right-channel input signal is supplied to the adder 44*b*.

The crosstalk component filter 41*a* filters out a crosstalk signal component from the left-channel input signal Lin to supply the filtered crosstalk signal component to the delay device 42*a*. The delay device 42*a* delays this filtered crosstalk signal by an inter aural time difference to supply this delayed crosstalk signal to the adder 44*b*. The delayed crosstalk signal of this delay device 42*a* corresponds to crosstalk sound reached from the left speaker to a right ear of an audience (will be referred to as a “left crosstalk sound” hereinafter). Similarly, the crosstalk component filter 41*b* filters out a crosstalk signal component from the right-channel input signal Rin to supply the filtered crosstalk signal component to the delay device 42*b*. The delay device 42*b* delays this filtered crosstalk signal by the inter aural time difference to supply this delayed crosstalk signal to the adder 44*b*. The delayed crosstalk signal of this delay device 42*b* corresponds to crosstalk sound reached from the right speaker to a left ear of the audience (will be referred to as a “right crosstalk sound” hereinafter).

The adder 44*a* adds the signal filtered from the left-channel sound image localizing filter 40*a* to the signal delayed from the delay device 42*b*. As a result, such a signal corresponding to mixture sound produced by mixing the right crosstalk sound with the sound applied with the left-channel external-ear transfer function is outputted from the adder 44*a* as a left-channel output signal Lout. Similarly, the adder 44*b* adds the signal filtered from the right-channel sound image localizing filter 40*b* to the signal delayed from the delay device 42*a*. As a result, such a signal corresponding to mixture sound produced by mixing the left crosstalk sound with the sound applied with the right-channel external-ear transfer function is outputted from the adder 44*b* as a right-channel output signal Rout. Then, these left-channel output signal Lout and right-channel output signal Rout are supplied to the D/A converter 14 (see FIG. 7).

Figure 10:
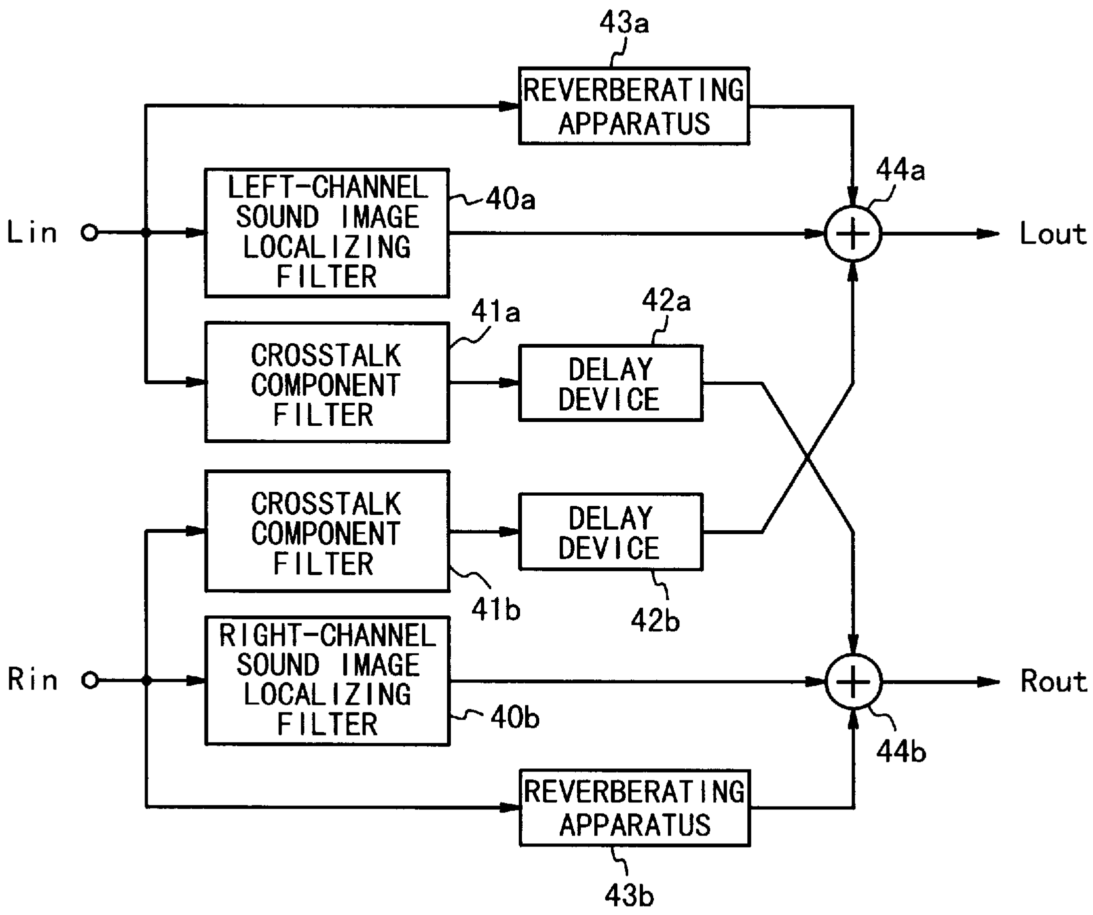
FIG. 10 is an explanatory diagram for explaining a sound image localizing process and a reverberation adding process performed in DSP of FIG. 7.

Also, when the acoustic signal is reproduced by using the headphone 23, the reverberation adding process operation may be carried out in addition to the above-explained sound image localizing process operation. In this case, as indicated in FIG. 10, a reverberating apparatus 43*a* and another reverberating apparatus 43*b* are newly added to the arrangement for the sound image localizing process operation, as indicated in FIG. 9. The reverberating apparatus 43*a* applies a reverberation component to the left-channel input signal Lin. This reverberation component may be applied as follows: For instance, the left-channel input signal Lin is supplied to a plurality of delay devices having different delay amounts. Then, signals delayed by the respective delay devices are added to each other. The reverberation signal derived from this reverberating apparatus 43*a* is supplied to the adder 44*a*. Similarly, another reverberating apparatus 43*b* applies another reverberation component to the right-channel input signal Rin. Then, the reverberation component applied signal of this reverberating apparatus 43*b* is supplied to the adder 44*b*.

The adder 44*a* adds the signal filtered from the left-channel sound image localizing filter 40*a* to the signal delayed by the delay device 42*b* and also the signal reverberated by the reverberating apparatus 43*a*. As a result, this adder 44*a* outputs as the left-channel output signal Lout, such a signal corresponding to mixture sound produced by mixing the right crosstalk sound, the left-channel reverberation sound, and the sound applied with the left-channel external-ear transfer function. Similarly, the adder 44*b* adds the signal filtered from the right-channel sound image localizing filter 40*b* to the signal delayed by the delay device 42*a* and also the signal reverberated by the reverberating apparatus 43*b*. As a result, this adder 44*b* outputs as the right-channel output signal Rout, such a signal corresponding to mixture sound produced by mixing the left crosstalk sound, the right-channel reverberation sound, and the sound applied with the right-channel external-ear transfer function. These left-channel output signal Lout and right-channel output signal Rout are supplied to the D/A converter 14 (see FIG. 7).

(3). Overall Operation of Electronic Musical Instrument

Figure 11:
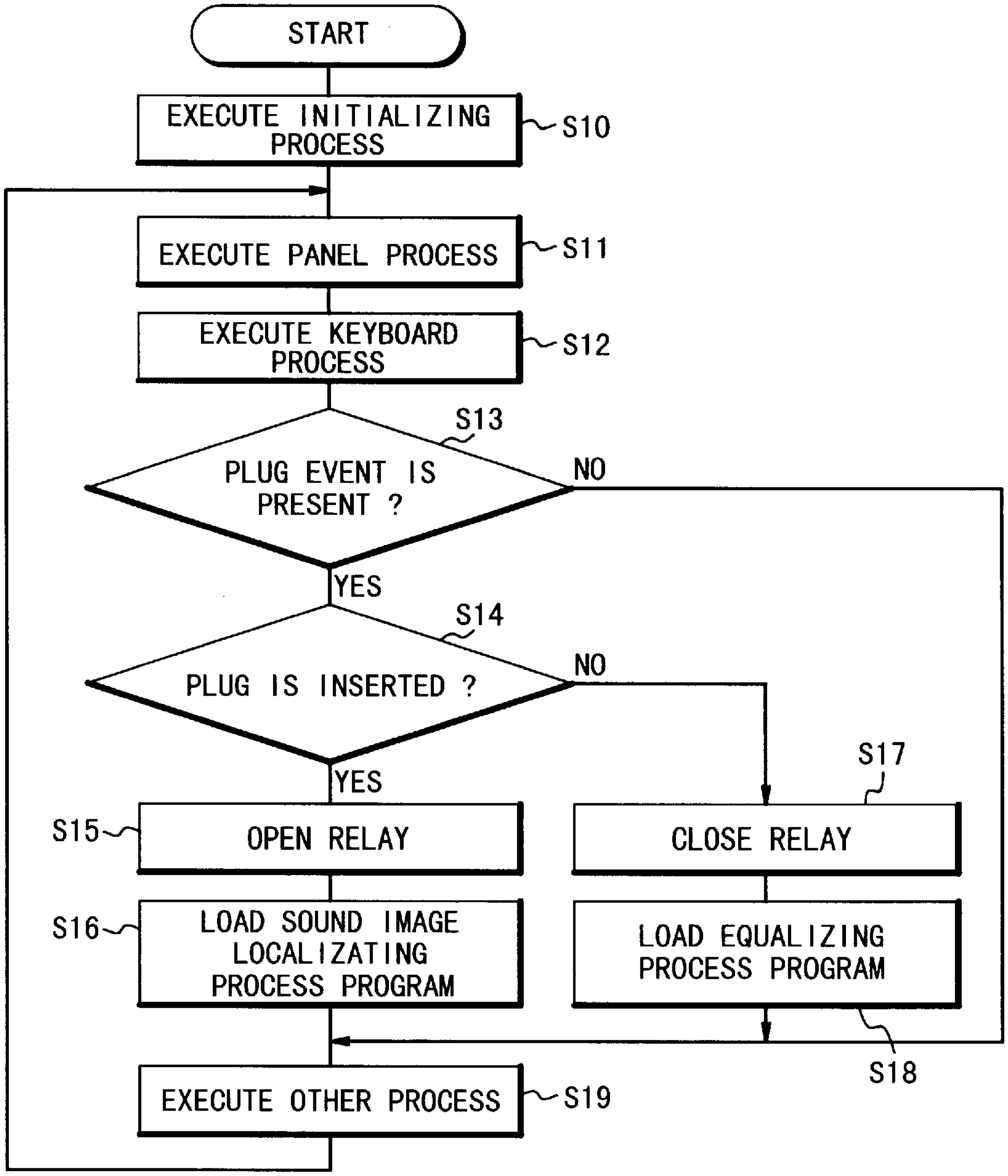
FIG. 11 is a flow chart for describing a process operation executed in CPU of FIG. 7.

Referring now to a flow chart shown in FIG. 11, overall operation of the electronic musical instrument with the above-described arrangement will be explained. It should be understood that the process operation described in the flow chart of FIG. 11 may be executed under control of the CPU 10.

When the power supply of the electronic musical instrument is turned ON, the CPU 10 firstly executes an initializing process at a step S10. In this initializing process, various sorts of hardware are initialized, and also various sorts of initial values are set to the RAM 110. Also, the contact of the relay 18 is closed. As a consequence, music sound may be reproduced from the speaker 19 immediately after the power supply is turned ON. Furthermore, the effect process program 102 is transferred to the RAM 130 under control of the CPU 10. As a result, various sorts of effects such as a chorus, a tremolo, and a vibrato may be always applied to the music sound.

Next, a panel process operation is carried out at a step S11. In this panel process, such a process operation is carried out in response to operation of an operation panel (not shown). Next, a keyboard process operation is performed at a step S12. In this keyboard process operation, a sound producing process and a sound disappearing process are carried out in response to operation of the keyboard 11.

Subsequently, a check is made as to whether or not an event of the plug 24 occurs at a step S13. In other words, the plug-in detector 22 is scanned, and a check is made as to whether or not the signal derived form this plug-in detector 22 is changed from the previous signal acquired when the previous scanning operation was carried out. In this case, when it is judged that there is no event in the plug 24, the process operation is branched to a further step S19.

On the other hand, when it is so judged that there is an event in the plug 24, another check is made as to whether or not the plug 24 is inserted into the headphone jack 21 at a step S14. This event check may be made by checking as to whether or not the signal derived from the plug-in detector 22 is under ON state. At this stage, when it is so judged that the plug 24 is inserted, the contact of the relay 18 is opened at a step S15. This relay open operation may be realized by set a control signal to the relay 18 to an active state. As a result, the sound reproduction from the speaker 19 is stopped. Under this stop condition, the audience can hear the sound reproduced from the headphone 23.

Next, the sound image localizing process program 104 stored in the ROM 100 is loaded to the RAM 130 at a step S16. As a consequence, since the above-explained sound image localizing process is carried out for the digital music sound signal supplied from the sound source 12, even when the music sound is heard by using the headphone 23, the audience can clearly have the feelings of the sound image localization.

Conversely, when it is so judged that the plug 24 is not inserted into the headphone jack 21 at the above-described step S14, the relay 18 is closed at a step S17. As a result, the sound reproduction from the speaker 19 is allowed. Under this condition, the audience can hear the music sound from the speaker 19. Subsequently, the equalizing process program 103 stored in the ROM 100 is loaded on the RAM 130 (step S18). As a consequence, since the above-explained equalizing process operation is carried out with respect to the digital music sound signal produced from the sound source 12, even when the audience hears the music sound by using the speaker 19, the music sound having the better frequency characteristic can be obtained. Thereafter, the process operation is branched to a step S19.

At this step S19, other process operation is carried out. In other process operation, for example, the MIDI process operation and the automatic playing process operation are carried out, a detailed operation of which is omitted. Thereafter, the process operation is branched to the step S11, and similar process operations are repeated.

Figure 12:
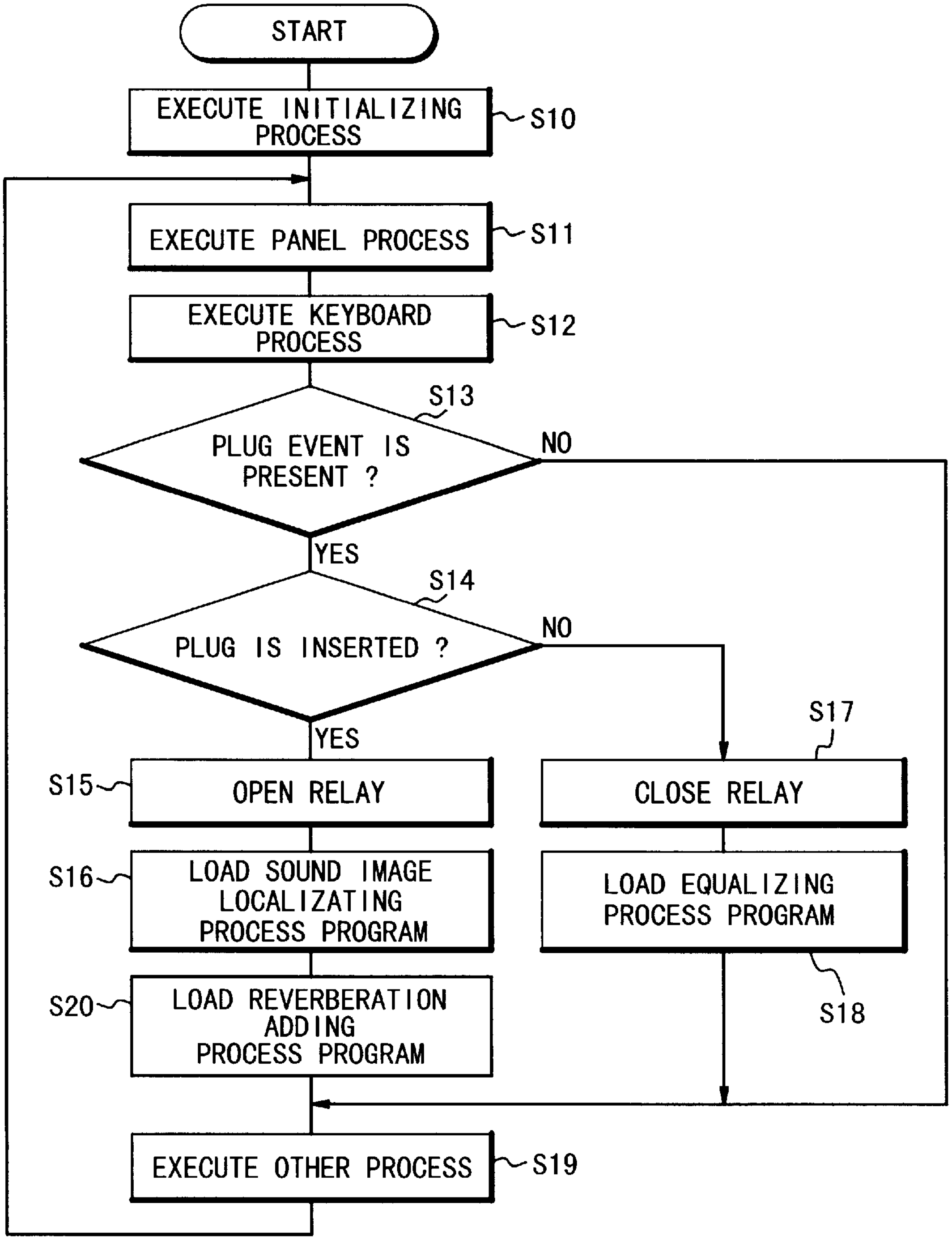
FIG. 12 is a flow chart for describing another process operation executed in CPU of FIG. 7.

In the above-explained electronic musical instrument, as indicated in FIG. 12, a further step S20 may be added subsequent to the above-explained step S16. At this step S20, the reverberation adding process program 105 is loaded to the RAM 130. As a result, in accordance with this loaded reverberation adding process program 105, as represented in FIG. 10, a reverberation adding process operation is carried out. In this additional function, the reverberation sound is applied to the music sound, so that realistic stereophonic effects can be furthermore achieved.

As previously described, in accordance with this embodiment, when the plug 24 of the headphone 23 is not inserted into the headphone jack 21, the equalizing process is carried. As a result, the music sound having such a better frequency characteristic can be produced from the speaker 19. On the other hand, when this plug 24 of the headphone 23 is inserted the sound image localizing process is carried out. Accordingly, the sound image can be clearly localized. In this case, when the reverberation adding process is further carried out, the audience can hear the music sound with realistic stereophonic effects from the headphone 23. As a consequence, in accordance with the music sound correcting apparatus of the present invention, even when a certain music sound is reproduced by using either the speaker or the headphone, the audience can have the substantially same audibilities. Moreover, since the above-described equalizing process, sound image localizing process, and reverberation adding process are carried out in the DSP 13, a total amount of hardware structures can be reduced.

It should be noted that the music sound correcting apparatus of the embodiment is arranged in such a manner that either the equalizing process program 103, or at least one of the sound image localizing program 104 and reverberation adding process program 105 is loaded, depending upon such a fact as to whether or not the plug 24 of the headphone 23 is inserted into the headphone jack 21. Alternatively, while these programs are loaded to the RAM 130 during the initializing process, any one of these loaded programs may be executed, depending upon such a fact that the plug 24 of the headphone 23 is inserted into the headphone jack 21.

Also, the above-explained equalizing process, sound image localizing process, and reverberation adding process are executed by way of the program process (software) operations by the DSP 13 in the above embodiment. These process operations may be realized by employing a hardware structure.

As previously described in detail, in accordance with the music sound correcting method/apparatus of the present invention, the preferable music sound can be equally reproduced by using any of the speaker and the headphone although a small amount of hardware structure is employed.

What is claimed is:

1. A music sound correcting apparatus for correcting a music sound signal entered thereinto to selectively supply the corrected music sound signal to a speaker and a headphone, comprising:

a jack into which a plug of said headphone is inserted;

a detector for detecting whether or not said plug of the headphone is inserted into said jack;

first correcting means for correcting said entered music sound signal to be properly reproduced by the speaker when said detector detects that said plug is not inserted into said jack; and second correcting means for correcting said entered music sound signal to be properly reproduced by the headphone when said detector detects that said plug is inserted into said jack.

2. A music sound correcting apparatus according to claim 1, wherein said first correcting means includes equalizing means for changing a frequency characteristic of music sound produced in response to said entered music sound signal.

3. A music sound correcting apparatus according to claim 2, wherein said entered music sound signal comprises a left-channel input signal and a right-channel input signal; and said equalizing means includes:

a plurality of first bandpass filters for filtering said left-channel input signal, wherein each of said first bandpass filters passes a unique frequency band of said left-channel input signal; and a plurality of second bandpass filters for filtering said right-channel input signal, wherein each of said second bandpass filters passes a unique frequency band of said right-channel input signal.

4. A music sound correcting apparatus according to claim 1, wherein said second correcting means includes sound image localizing means for localizing a sound image formed based upon said entered music sound signal at a preselected position.

5. A music sound correcting apparatus according to claim 4, wherein said first correcting means includes equalizing means for changing a frequency characteristic of music sound produced in response to said entered music sound signal.

6. A music sound correcting apparatus according to claim 5, wherein said entered music sound signal comprises a left-channel input signal and a right-channel input signal; and said equalizing means includes:

a plurality of first bandpass filters for filtering said left-channel input signal, wherein each of said first bandpass filters passes a unique frequency band of said left-channel input signal; and a plurality of second bandpass filters for filtering said right-channel input signal, wherein each of said second bandpass filters passes a unique frequency band of said right-channel input signal.

7. A music sound correcting apparatus according to claim 4, wherein said entered music sound signal comprises a left-channel input signal and a right-channel input signal; and said sound image localizing means includes:

a left-channel sound image localizing filter for applying a left-channel external-ear transfer function to said left-channel input signal;

a right-channel crosstalk component filter for deriving a crosstalk component from said right-channel input signal;

a right-channel delay device for delaying the crosstalk component derived from said right-channel crosstalk component filter by an inter aural time difference;

a left-channel adder for mixing the signal filtered from said left-channel sound image localizing filter with the signal delayed by said right-channel delay device;

a right-channel sound image localizing filter for applying a right-channel external-ear transfer function to said right-channel input signal;

a left-channel crosstalk component filter for deriving a crosstalk component from said left-channel input signal;

a left-channel delay device for delaying the crosstalk component derived from said left-channel crosstalk component filter by the inter aural time difference;

a right-channel adder for mixing the signal filtered from said right-channel sound image localizing filter with the signal delayed by said left-channel delay device.

8. A music sound correcting apparatus according to claim 7, wherein said first correcting means includes equalizing means for changing a frequency characteristic of music sound produced in response to said entered music sound signal.

9. A music sound correcting apparatus according to claim 3, wherein said entered music sound signal comprises a left-channel input signal and a right-channel input signal; and said equalizing means includes:

a plurality of first bandpass filters for filtering said left-channel input signal, wherein each of said first bandpass filters passes a unique frequency band of said left-channel input signal 1; and a plurality of second bandpass filters for filtering said right-channel input signal, wherein each of said second bandpass filters passes a unique frequency band of said right-channel input signal.

10. A music sound correcting apparatus according to claim 4, wherein said second correcting means further includes reverberation adding means for applying a reverberation component to said entered music sound signal.

11. A music sound correcting apparatus according to claim 10, wherein said entered music sound signal comprises a left-channel input signal and a right-channel input signal; and said reverberation adding means includes:

a left reverberating apparatus for applying a reverberation component to said left-channel input signal; and a right reverberating apparatus for applying a reverberation component to said right-channel input signal; and wherein said sound image localizing means includes:

a left-channel sound image localizing filter for applying a left-channel external-ear transfer function to said left-channel input signal;

a right-channel crosstalk component filter for deriving a crosstalk component from said right-channel input signal;

a right-channel delay device for delaying the crosstalk component derived from said right-channel crosstalk component filter by an inter aural time difference;

a left-channel adder for mixing the signal filtered from said left-channel sound image localizing filter, the signal delayed by said right-channel delay device and the signal applied the reverberation component by said left reverberating apparatus;

a right-channel sound image localizing filter for applying a right-channel external-ear transfer function to said right-channel input signal;

a left-channel crosstalk component filter for deriving a crosstalk component from said left-channel input signal;

a left-channel delay device for delaying the crosstalk component derived from said left-channel crosstalk component filter by the inter aural time difference;

a right-channel adder for mixing the signal filtered from said right-channel sound image localizing filter, the signal delayed by said left-channel delay device and the signal applied the reverberation component by said right reverberating apparatus.

12. A music sound correcting apparatus for correcting a music sound signal entered thereinto to selectively supply the corrected music sound signal to a speaker and a headphone, comprising:

first storage means for storing an equalizing process program and a sound image localizing process program;

second storage means, a content of which is rewritable;

a jack into which a plug of said headphone is inserted;

a detector for detecting whether or not said plug of the headphone is inserted into said jack;

control means for transferring said equalizing process program read from said first storage means to said second storage means when said detector detects that said plug of the headphone is not inserted into said jack; and for transferring said sound image localizing process program read from said first storage means to said second storage means when said detector detects that said plug of the headphone is inserted into said jack; and a digital signal processor for processing said entered music sound signal such that when said equalizing process program is transferred to said second storage means by said control means, said entered music sound signal is corrected in accordance with said equalizing process program to be properly reproduced by the speaker, and when said sound image localizing process program is transferred to said second storage means by said control means, said entered music sound signal is corrected in accordance with said sound image localizing process program to be properly reproduced by the headphone.

13. A music sound correcting apparatus according to claim 12, wherein said equalizing process program changes a frequency characteristic of music sound produced in response to said entered music sound signal.

14. A music sound correcting apparatus according to claim 12, wherein said sound image localizing process program localizes a sound image formed in response to said entered music sound signal to a preselected position.

15. A music sound correcting apparatus according to claim 12, wherein said first storage means further stores thereinto a reverberation adding process program used to add a reverberation component to said entered music sound signal;

when said detector detects that said plug of the headphone is inserted into said jack, said control means transfers said sound image localizing process program and said reverberation adding process program read from said first storage means to said second storage means, and then said digital signal processor corrects said entered music sound signal in accordance with said sound image localizing process program and said reverberation adding process program to be properly reproduced by the headphone.

16. A music sound correcting method comprising the steps of:

detecting whether or not a plug of a headphone is inserted into a jack;

executing a first correction to an inputted music sound signal to be properly reproduced by a speaker when a detection is made such that said plug of the headphone is not inserted into the jack; and executing a second correction to the inputted music sound signal to be properly reproduced by the headphone when a detection is made such that said plug of the headphone inserted into the jack.

17. A music sound correcting method according to claim 16, wherein said first correction is to change a frequency characteristic of music sound produced in response to said input music sound signal.

18. A music sound correcting method according to claim 16, wherein said second correction is to localize a sound image formed in response to said input music sound signal to a predetermined position.

19. A music sound correcting method according to claim 18, wherein said first correction is to change a frequency characteristic of music sound produced in response to said input music sound signal.

20. A music sound correcting method according to claim 18, further comprising the step of:

adding a reverberation component to said input music sound signal.

* * * * *